United States Patent [19]

Lai et al.

[11] Patent Number: 4,888,634
[45] Date of Patent: Dec. 19, 1989

[54] HIGH THERMAL RESISTANCE BONDING MATERIAL AND SEMICONDUCTOR STRUCTURES USING SAME

[75] Inventors: Chong K. Lai, Santa Clara; Robert C. Dobkin, San Jose, both of Calif.

[73] Assignee: Linear Technology Corporation, Milpitas, Calif.

[21] Appl. No.: 307,234

[22] Filed: Feb. 3, 1989

Related U.S. Application Data

[63] Continuation of Ser. No. 77,170, Jul. 24, 1987.

[51] Int. Cl.⁴ .................... H01L 23/28; H01L 39/02; H01L 23/02
[52] U.S. Cl. .................................. 357/72; 357/80; 357/81
[58] Field of Search .................................. 357/72, 80

[56] References Cited

U.S. PATENT DOCUMENTS 3,996,602 12/1976 Goldberg et al. .................. 357/72
4,328,150 5/1982 Kondow et al. .................. 357/72
4,803,543 2/1989 Inayoshi .......................... 357/72

FOREIGN PATENT DOCUMENTS 97634 6/1982 Japan .................................. 357/80
136231 7/1985 Japan .................................. 357/72
189229 9/1985 Japan .................................. 357/72

Primary Examiner—Rolf Hille
Assistant Examiner—Robert P. Limanek
Attorney, Agent, or Firm—Flehr, Hohbach, Test Albritton & Herbert

[57] ABSTRACT

A high thermal resistance bonding material for semiconductor chips includes a binder such as epoxy or polyimide and high thermal resistance material dispersed therein such as glass micropheres, glass beads, ceramic microspheres and ceramic beads. The particles of high thermal resistance material are sieved to obtain particles of generally uniform size. In plastic-encapsulated semiconductor chips, each chip is enveloped by the bonding material.

5 Claims, 1 Drawing Sheet

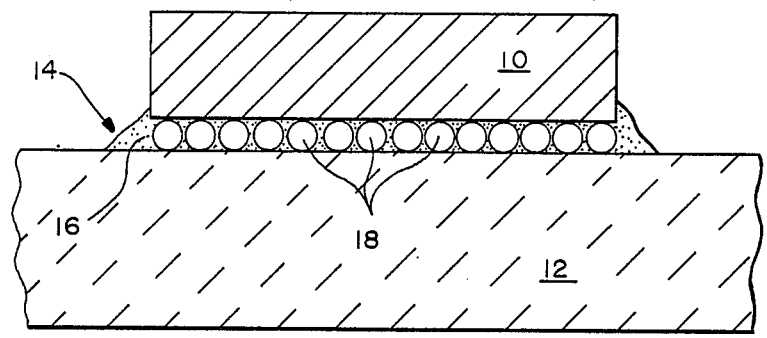
FIG.—1
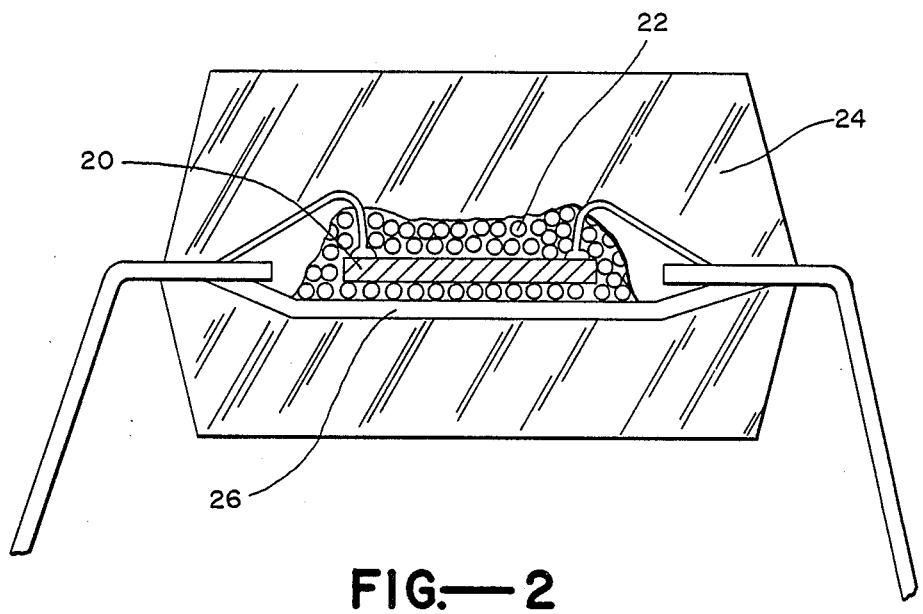
FIG.—2

4,888,634

HIGH THERMAL RESISTANCE BONDING MATERIAL AND SEMICONDUCTOR STRUCTURES USING SAME

BACKGROUND OF THE INVENTION

This is a continuation of application Ser. No. 77,170 filed Jul. 24, 1987.

This invention relates generally to semiconductor devices and structures, and more particularly the invention relates to semiconductor structures in which semiconductor chips have improved thermal operating environments.

Semiconductor chips are typically mounted in a cavity of a hermetically sealed package or in a plastic encapsulated package. The chips are bonded to a support substrate by a suitable adhesive. In power devices where a considerable amount of heat is generated by the chip, good heat transfer from the chip to the substrate and package is desired for heat dissipation. However, some integrated circuit chips do not generate sufficient heat to require heat dissipation through the package. More importantly, a uniform temperature throughout the chip or between chips mounted in the same package is desired. Thus, provision of a uniform and high thermal resistance between the chip and the substrate and package is required.

SUMMARY OF THE INVENTION

An object of the present invention is a packaged semiconductor chip having improved thermal resistance between the chip and package.

Another object of the invention is a bonding material for bonding semiconductor chips to support substrates and providing uniform, high thermal resistance between the chips and the substrates.

A feature of the invention is a bonding material comprising a binder and high thermal resistance material dispersed therein.

Briefly, in preparing the bonding material in accordance with the invention, a suitable binder such as epoxy, silicone or polyimide is provided. High thermal resistance material such as glass and ceramic beads and microspheres of a generally uniform size are added to the binder. The bonding material is then applied between a semiconductor chip and a supporting substrate and thermally cured. In a plastic-encapsulated device, the cured bonding material envelopes the semiconductor chip before the plastic encapsulation.

The invention and objects and features thereof will be more readily apparent from the following detailed description and appended claims when taken with the drawing.

BRIEF DESCRIPTION OF THE DRAWING

FIG. 1 is a side view, partially in section, of a semiconductor chip mounted on a substrate of a hermetically sealed package using bonding material in accordance with one embodiment of the invention.

FIG. 2 is a side view in section of a plastic-encapsulated semiconductor chip using bonding material in accordance with one embodiment of the invention.

DETAILED DESCRIPTION OF ILLUSTRATIVE EMBODIMENTS

FIG. 1 is a side view, partially in section, of a semiconductor chip 10 mounted on a supporting substrate 12 as in a hermetically sealed package. The chip 10 is separated from the package by air space except at the bottom surface of the chip which is attached to the substrate 12 by means of an adhesive shown generally at 14. As noted above, in power devices it is desirable to facilitate heat transfer from a semiconductor chip to the substrate and the package for heat-dissipation purposes. However, in many integrated circuits it is more important to provide a uniform temperature throughout the semiconductor chip and between semiconductor chips mounted in the same package.

In accordance with the present invention, the adhesive 14 comprises a binder such as an epoxy or polyimide shown at 16 in which high thermal resistance material such as glass microspheres 18 are dispersed. The glass microspheres increase the thermal resistance of the adhesive, and the uniform distribution of the glass microspheres facilitates uniform thermal resistance between the semiconductor chip 10 and the substrate 12.

FIG. 2 is a section view of a plastic-encapsulated chip in accordance with another embodiment of the invention. In this embodiment the chip 20 is embedded in bonding material 22 in accordance with the invention prior to the encapsulation within the plastic package 24. After coating the semiconductor chip 20 with the bonding material 22, the chip 20 is placed on a die paddle 26 of a lead frame prior to curing of the bonding material. Thus, the semiconductor chip is bonded to the die paddle 26 and is totally encapsulated in the bonding material 22 prior to the plastic encapsulation.

In fabricating the bonding material in accordance with one embodiment of the invention, a binder of DuPont 2561 polyimide is employed. Commercially available glass microspheres are sieved to obtain uniformly-sized microspheres. Microspheres having diameters of 3–4 mils, 4–5 mils, and 5–6 mils, have been employed in different embodiments. The uncured polyimide is in fluid form at room temperature, and after the high thermal resistance material is added to the binder the bonding material is applied to a semiconductor chip as described above. Thereafter, in curing the bonding material, the semiconductor device is temperature-cycled. Using DuPont 2561 polyimide, the bonding material and semiconductor device are heated to 90° C. for one hour, 150° C. for one hour, and to 300° C. for one hour to effect the cure.

Other binders such as epoxy and silicone can be employed, and other high thermal resistance material such as glass and ceramic beads and ceramic bubbles can be employed.

Bonding material in accordance with the invention has proved to be successful in improving the uniformity of operating temperature of packaged integrated circuit chips. While the invention has been described with reference to specific embodiments, the description is illustrative of the invention and not to be construed as limiting the invention. Various modifications and applications may occur to those skilled in the art without departing from the true spirit and scope of the invention as defined by the appended claims.

We claim:

1. A semiconductor structure combination in which a uniform temperature is provided throughout a semiconductor chip, said combination comprising a supporting substrate for said chip, and a bonding material between and in direct contact with said chip and said substrate, said bonding material including a binder and high thermal resistance material in the form of sieved particles of generally uniform size with diameters of at least two mils, said particles being dispersed throughout said binder and providing uniform spacing and uniform thermal insulation between said chip and said substrate.

2. The combination as defined by claim 1 wherein said bonding material envelopes said chip.

3. The combination as defined by claim 1 wherein said binder is selected from the group consisting of silicone, epoxy and polyimide.

4. The combination as defined by claim 3 wherein said high thermal resistance material is selected from the group consisting of glass microspheres, glass beads, ceramic microspheres, and ceramic beads.

5. The combination as defined by claim 1 wherein said high thermal resistance material is selected from the group consisting of glass microspheres, glass beads, ceramic microspheres, and ceramic beads.

* * * * *